(12) United States Patent
Onishi

(10) Patent No.: US 7,852,895 B2
(45) Date of Patent: Dec. 14, 2010

(54) VCSEL WITH REDUCED LIGHT SCATTERING WITHIN OPTICAL CAVITY

(75) Inventor: Yutaka Onishi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 17 days.

(21) Appl. No.: 12/392,410

(22) Filed: Feb. 25, 2009

(65) Prior Publication Data

US 2009/0213892 A1    Aug. 27, 2009

(30) Foreign Application Priority Data

Feb. 26, 2008    (JP) ............................. 2008-044813

(51) Int. Cl.
*H01S 5/00*    (2006.01)
(52) U.S. Cl. ................ 372/50.11; 372/50.124
(58) Field of Classification Search .............. 372/50.11, 372/96, 50.122
See application file for complete search history.

(56) References Cited

U.S. PATENT DOCUMENTS

2004/0218655 A1 * 11/2004 Tandon et al. ................. 372/96

2005/0063440 A1 * 3/2005 Deppe ......................... 372/50

OTHER PUBLICATIONS

N. Nishiyama et al., "High efficiency long wavelength VCSEL on InP grown by MOCVD", Electronics Letters, vol. 39 (5), 2003, pp. 437-439.

* cited by examiner

*Primary Examiner*—Minsun Harvey
*Assistant Examiner*—Patrick Stafford
(74) *Attorney, Agent, or Firm*—Smith, Cambrell & Russell, LLP

(57) ABSTRACT

A VCSEL with a structure able to reduce the scattering within the optical cavity and its manufacturing method are disclosed. The VCSEL of the present invention provides, on the semiconductor substrate, the first DBR, the active layer, the p-type spacer layer, the heavily doped p-type mesa, the heavily doped n-type layer, the first n-type spacer and the second DBR in this order. The heavily doped n-type layer, which is formed so as to cover the p-type spacer layer and the heavily doped p-type mesa, forms the tunnel junction with respect to the heavily doped p-type mesa. Because the height, which is appeared in the surface of the n-type spacer layer, reflects the height of the heavily doped p-type mesa and is comparatively small, the light scattering between the second DBR and the n-type spacer layer is suppressed.

4 Claims, 6 Drawing Sheets

VCSEL WITH REDUCED LIGHT SCATTERING WITHIN OPTICAL CAVITY

BACKGROUND OF THE INVENTION

1. Field of the Invention

The present invention relates to a vertical cavity surface emitting laser diode (hereafter simply denoted as VCSEL) and a method to form the VCSEL.

2. Relater Background Art

Nishiyama et al. has reported one type VCSEL in Electronics Letters, vol. 39(5) (2003) pp. 437-439, in which the VCSEL provides, on the InP substrate, a Bragg reflector (hereafter simply denoted as DBR) formed by a combination of AlGaInAs and InP, an active layer, an n-type InP layer to bury a tunnel junction region with a mesa shape, and another Bragg reflector (DBR) made of multi-layered dielectric film. The mesa shaped tunnel junction region is formed by an etching of a heavily doped p-type layer and a heavily doped n-type layer.

The VCSEL described above provides the mesa shaped tunnel junction region after the formation of double layers of the heavily doped n-type and p-type layers; accordingly, the height of the mesa for the tunnel junction region inevitably increases, substantially a sum of two heavily doped layers. Because an n-type InP layer grown so as to cover the tunnel junction region shows a step with a comparable height, and the multi-layered dielectric film for the DBR is formed on this n-type InP layer with the larger step, the step in the surface of the n-type layer causes scattering of the light generated in the active layer, which degrades the performance of the VCSEL. Thus, the present invention is to provide a structure for the VCSEL to reduce the light scattering within the optical cavity and to provide a method to form the VCSEL.

SUMMARY OF THE INVENTION

One aspect of the present invention relates to a layer structure of a VCSEL, in which the VCSEL provides, on a semiconductor substrate, a first Bragg reflector, an active layer, a p-type spacer layer, a heavily doped p-type mesa, a heavily doped n-type layer, a first n-type spacer layer and a second Bragg reflector in this order. The first Bragg reflector (hereafter shortly denoted as DBR) is comprised of an n-type semiconductor material, namely, it includes a plurality of first semiconductor layers and second semiconductor layers alternately stacked to each other. The p-type spacer layer includes a first area and a second area surrounding the first area. The heavily doped p-type mesa is formed on this first area of the p-type spacer layer, while, the heavily doped n-type layer covers the second area of the p-type spacer layer and the top and the side of the heavily doped p-type mesa. Thus, a tunnel junction is formed between the heavily doped p-type mesa and the heavily doped n-type layer.

The VCSEL of the present invention has a feature that the only the heavily doped p-type layer forms a mesa, and the heavily doped n-type layer covers this mesa. Although a step is appeared on the surface of the first n-type spacer layer provided on the heavily doped n-type layer as reflecting the heavily doped p-type mesa, a height of this step is comparatively small because the step only reflects the mono-layer of the heavily doped p-type mesa. Therefore, the light scattering by this step formed between the n-type spacer layer and the second DBR may be suppressed in spite of the unevenness within the optical cavity.

In the VCSEL of the invention, the heavily doped p-type mesa only covers the first area of the p-type spacer layer and the heavily doped n-type layer covers the second area. The light absorption due to the n-type layer is generally insensitive to the doping density thereof compared to the p-type layer, because the free electron absorption becomes dominant in the n-type layer, while, the inter-band transition is dominant in the p-type layer. Therefore, the VCSEL of the present invention may suppress the light absorption in the second area. Moreover, the heavily doped n-type layer on the second area is formed thin, which may further suppress the light absorption in the second area.

The VCSEL of the present invention may provide a region, within the p-type spacer layer and the active layer, beneath the first area and another region, also within the p-type spacer layer and the active layer, beneath the second area. The other region may provide the resistivity greater than that of the region beneath the first area. This arrangement of two regions may reduce the parasitic capacitance of the VCSEL. The region beneath the second area may be formed by the ion implantation using proton or oxygen ions.

The heavily doped p-type mesa may be comprised of material containing gallium (Ga) and arsine (As), while, the heavily doped n-type layer may be comprised of material containing indium (In), gallium (Ga) and arsine (As). Further, the n-type spacer layer may be comprised of material containing gallium (Ga) and at least one of arsine (As) and phosphorus (P).

Another aspect of the present invention relates to a method to from the VCSEL. The method includes steps of: (a) sequentially growing, on a semiconductor substrate, a first DBR layer, an active layer, a p-type spacer layer, and a heavily doped p-type layer; (b) forming a heavily doped p-type mesa by etching the heavily doped p-type layer; and (c) sequentially growing a heavily doped n-type layer, a first n-type spacer layer and a second DBR layer. The p-type spacer layer includes a first area and a second area, and the heavily doped p-type mesa is formed only on the first area of the p-type spacer layer.

The method of the present invention may further provide a step of thermally treating the heavily doped p-type mesa before growing the heavily doped n-type layer. This process where the thermal treatment is carried out before the growth of the heavily doped n-type layer may effectively prevent the inter-diffusion of impurities heavily doped within respective layers of the p-type mesa and the n-type layer. Moreover, the thermal treatment before the subsequent growth may effectively enhance the activation efficiency of the p-type impurities doped in the heavily doped p-type mesa.

The process to form the VCSEL of the present invention may further provide a step of the ion implantation to the p-type spacer layer and the active layer before the subsequent growth of the heavily doped n-type layer. The implanted species may be one of proton and oxygen ions. A portion of the p-type spacer layer and the active layer ion-implanted with proton or oxygen atoms may increase the resistivity thereof, which may reduce the parasitic capacitance of the VCSEL.

DETAILED DESCRIPTION OF PREFERRED EMBODIMENTS

The substance of the present invention will be easily understood by the description presented below as referring to accompanying drawings. Next, preferred embodiments of the vertical cavity surface emitting laser diode according to the present invention will be described as referring to drawings. In the description of the drawings, the same numerals or the same symbols will refer to the same elements without over lapping explanations.

Figure 1:
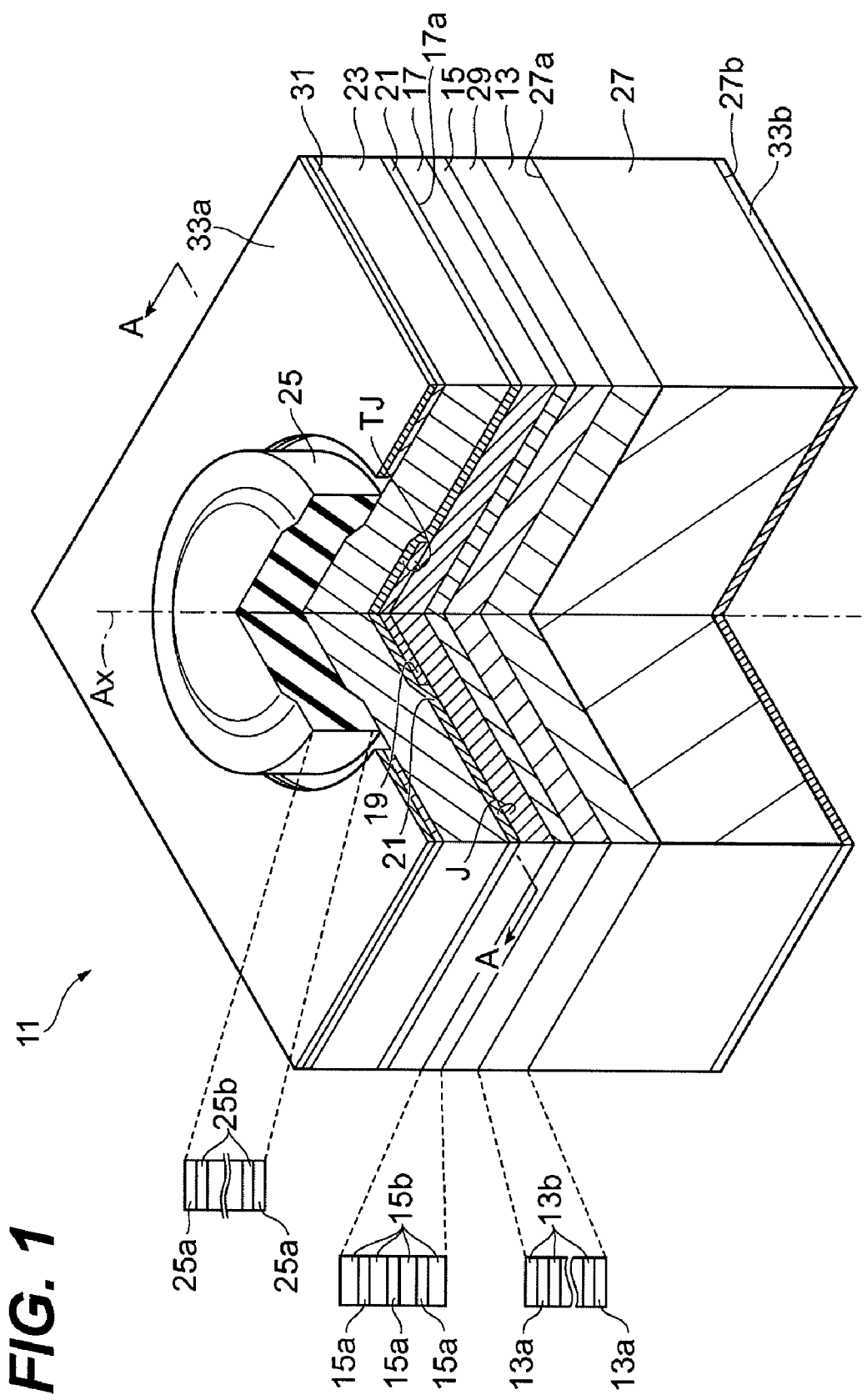
FIG. 1 is a perspective view of a VCSEL according to an embodiment of the present invention.
Figure 2A:
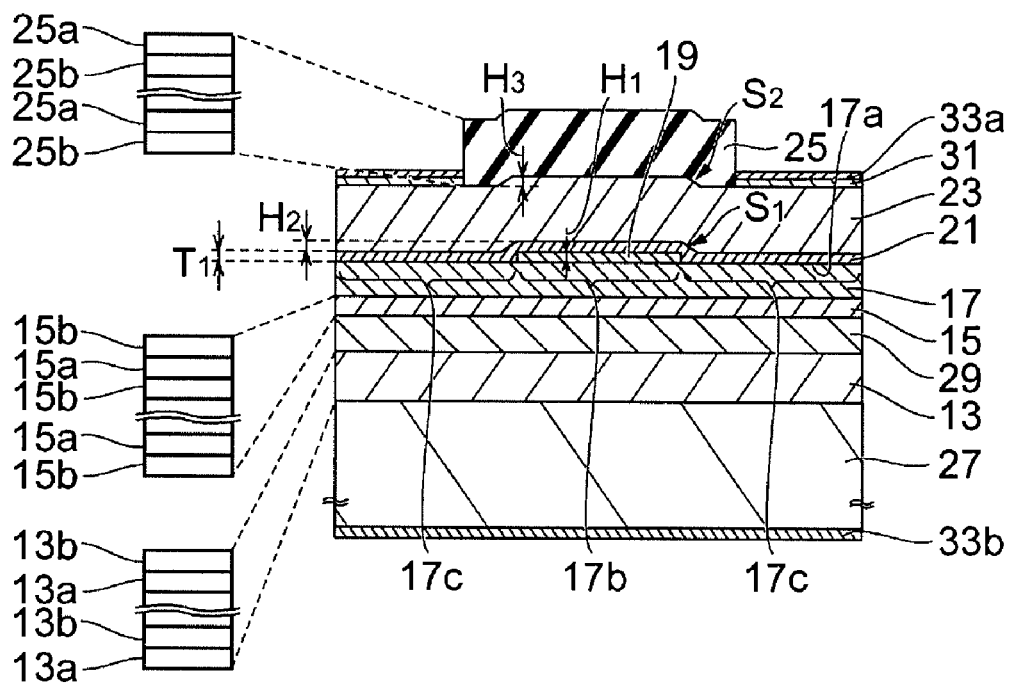
FIG. 2A is a cross sections, which are taken along the axis Ax in FIG. 1, of the VCSEL.

FIG. 1 is a perspective drawing of a vertical cavity surface emitting laser diode (VCSEL) according to an embodiment of the present invention. The VCSEL 11 provides a first Bragg reflector (hereafter denoted as the first DBR) 13, an active layer 15, a p-type space layer 17, a heavily doped p-type mesa 19, a heavily doped n-type layer 21, a first n-type space layer 23, and a second DBR layer (hereafter denoted as the second DBR) 25. FIG. 2A is a cross section of the VCSEL shown in FIG. 1, which is taken along the line A-A. The arrangement of the VCSEL 11 will be described as referring to FIG. 1 and FIG. 2A.

The first DBR 13 is provided on an n-type semiconductor substrate 27 that may be a group III-V compound semiconductor material such as GaAs. The first DBR 13 includes a plurality of first layers 13a and second layers 13b stacked alternately to each other. For instance, 32 pairs of the first and second layers, 13a and 13b, are arranged on the substrate 27. The first layer 13a may be an n-type GaAs, an n-type AlGaAs, and so on; while, the second layer 13b may be an n-type AlGaAs, an n-type InGaP and so on.

The active layer 15 is formed on the first DBR layer 13. The active layer 15 may have the quantum well structure including a plurality of well layers 15a and barrier layers 15b alternating to each other. The well layer 15a may be an un-doped InGaAs, an un-doped GaInNAs, an un-doped GaInNAsSb, and so on. The barrier layer 15b may be an un-doped InGaAs, an un-doped GaAs, an un-doped GaAsP, an un-doped GaNAs, and so on.

The p-type space layer 17, which is provided on the active layer 15, includes a primary surface 17a that comprises a first area 17b and a second area 17c surrounding the first area 17b. The p-type spacer layer 17, which may be a p-type GaAs, a p-type AlGaAs, a p-type InGaP, and so on, has a thickness of about 60 nm, preferably thicker than 30 nm and thinner than 1 µm. A pn junction formed by the p-type space layer 17 with such a thickness and the heavily doped n-type layer 21 may block currents in regions without tunnel junctions. The p-type spacer layer 17 with a thickness greater than 1 µm may show a greater inter-band absorption and may degrade the laser performance.

The heavily doped p-type mesa 19 is formed in the first area 17b on the primary surface 17a of the p-type space layer 17. The heavily doped p-type mesa 19, which may be a p-type InGaAs, a p-type GaAs, a p-type GaAsSb, and so on, has a doping concentration $[N_A]$ of about $1 \times 10^{20}$ cm$^{-3}$ and a height of about 10 nm, preferably higher than 4 nm and lower than 30 nm. A thinner heavily doped p-type mesa 19 results in higher resistance of the tunnel junction, while, a thicker heavily doped p-type mesa 19 increases an optical loss due to the absorption therein, which degrades the laser performance.

The heavily doped n-type layer 21 is formed on the first area 17b and also on the second area 17c so as to cover the top and the side of the heavily doped p-type mesa 19. Accordingly, the heavily doped n-type layer 21 forms a step $S_1$ between a region directly on the heavily doped p-type mesa 19 and a region directly on the p-type space layer 17. The height $H_2$ of the step $S_1$ is comparable to the height $H_1$ of the heavily doped p-type mesa 19. Thus heavily doped n-type layer 21 forms the tunnel junction TJ with the heavily doped p-type mesa 19, while, it forms the pn junction J with the p-type spacer layer 17 in the second area 17c. This heavily doped n-type layer 21, which may be an n-type InGaAs, an n-type GaAs, and so on, has a doping concentration $[N_D]$ of about $5 \times 10^{18}$ cm$^{-3}$ and a thickness $T_1$ of about 15 nm, preferably thicker than 4 nm and thinner than 30 nm. A thinner heavily doped n-type layer 21 results in an increase of the resistance of the tunnel junction, while, a thicker heavily doped n-type layer 21 results in an increase of the absorption loss, which degrades the laser performance.

When the n-type semiconductor substrate 27 is n-type GaAs, the heavily doped p-type mesa 19 and the heavily doped n-type layer 21 may be selected from a group of GaAs, GaAsSb, InGaAs, GaNAs, GaInP, InGaAsSb, AlGaInP, GaInAsP, GaInNAs, and GaInNAsSb. On the other hand, when the n-type semiconductor substrate 27 is n-type InP, the heavily doped p-type mesa 19 and the heavily doped n-type layer 21 may be selected from a group of InP, InGaAs, AlGaInAs, GaInAsP, AlInAs and AlGaAsSb.

The first n-type spacer layer 23 is formed on the heavily doped n-type layer 21. The first n-type spacer layer 23, because of being formed on the heavily doped n-type layer 21 with the step $S_1$, shows a second step $S_2$ in an interface between an area above the heavily doped p-type mesa 19 and another area off from the heavily doped p-type mesa 19. The height $H_3$ of the second step $S_2$ is comparable with the height $H_2$ of the first step $S_1$. The first n-type space layer 23, which may be an n-type GaAs, an n-type InGaP, and so on, has a thickness of about 90 nm, preferably an integral multiple of a characteristic length $\lambda/4/n$, where $\lambda$ is an oscillation wavelength and n is an equivalent refractive index of the resonator. According to such a configuration for the first n-type space layer 23, the tunnel junction that shows a larger optical absorption may be located in a poison where an optical magnitude becomes a minimum in the optical cavity. The first n-type spacer layer 23 may be thinner than 1 µm. A thicker first n-type space layer 23, which equivalently means a longer optical cavity, causes an increase of the threshold current and a degradation of high frequency performance of the device.

The second DBR layer 25 is formed on the first n-type space layer 23. The second DBT layer 25 includes a plurality of first dielectric layers 25a and second dielectric layers 25b alternately stacked to each other. The first dielectric layer 25a may be $SiO_2$, $Al_2O_3$, $CaF_2$, and so on, while, the second dielectric layer 25b may be $TiO_2$, SiN, α-Si, ZnS, $ZrO_2$, and so on.

Thus, according to the arrangement of the layers of the present embodiment shown in FIG. 2A, the heavily doped n-type layer 21 provides the step $S_1$ at the interface between the area on the heavily doped p-type mesa 19 and the area off from the heavily doped p-type mesa 19. The first n-type space layer 23 also provides the second step $S_2$ at the interface between the area above the heavily doped p-type mesa 19 and the area off from the heavily doped p-type mesa 19. The height $H_2$ of the first step $S_1$ is comparable with the thickness of the height $H_1$ of the heavily doped p-type mesa 19, while, the height $H_3$ of the second step $S_2$ is comparable with the height $H_2$ of the first step $S_1$. Accordingly, the height $H_3$ of the second step $S_2$ becomes comparable with the height $H_1$ of the heavily doped p-type mesa 19, which is considerably small. Although the second DBR layer 25 is formed on the first n-type space layer 23 so as to cover the second step $S_2$, the optical scattering between the second DBR layer 25 and the first n-type space layer 23, in particular, at the second step $S_2$ may be reduced.

The VCSEL 11 may further provide the second n-type space layer 29 on the first DBR layer 13. The second n-type space layer 29, which may be an n-type GaAs, an n-type AlGaAs, an n-type InGaP, and so on, preferably has a thickness of about 40 nm. The VCSEL 11 may further provide, on the first n-type space layer 23, the contact layer 31 with an opening. A contact layer without any openings causes an optical loss within the contact layer, which degrades the laser performance. Within the opening in the contact layer 31 and on the first n-type space layer 23 is provided with the second DBR layer 25. The contact layer 31, which may be an n-type GaAs, an n-type InGaAs, and so on, preferably has a thickness of about 50 nm.

The heavily doped n-type layer 21 of the VCSEL 11 according to the present embodiment extends in the second area 17c of the p-type space layer 17. The electron concentration [n] in the heavily doped n-type layer 21 is less than the hole concentration [p] in the heavily doped p-type mesa 19. The electron concentration [n] is equivalent to a density of n-type impurities electrically active in the layer, while, the hole concentration [p] is equivalent to a density of p-type impurities electrically active in that layer. It is quite hard in semiconductor materials belonging to GaAs system to cope with both a steep doping profile and a heavily doping concentration for the n-type impurities and a higher, that is, an n-type dopant able to get the steep doping profile is hard to enhance the electron concentration [n] because of lesser activating co-efficient. Accordingly, it is inevitable to enhance the hole concentration [p] to reduce the resistance of the tunnel junction. The electron concentration [n] in the heavily doped n-type layer 21 is less than the hole concentration [p] in the heavily doped p-type mesa 19.

For instance, the electron concentration [n] in the heavily doped n-type layer 21 may be $5 \times 10^{18}$ cm$^{-3}$ when it is doped with silicon (Si) by a density of $5 \times 10^{19}$ cm$^{-3}$, while, the hole concentration [p] in the heavily doped p-type mesa 19 may be $9 \times 10^{19}$ cm$^{-3}$ when it is doped with carbon (C) by a density of $1 \times 10^{20}$ cm$^{-3}$. The optical absorption in the n-type layer primarily due to the free electron absorption is less dependent on the doping density of the n-type impurity doped therein. Accordingly, the heavily doped n-type layer 21 within the optical cavity does not cause a large absorption loss of the laser light. Moreover, because the electron concentration [n] in the heavily doped n-type layer 21 is less than the hole concentration [p] in the heavily doped p-type mesa 19, the depletion layer of the pn junction at the interface therebetween extends toward the heavily doped n-type layer 21, which may suppress the increase of the junction capacitance.

Figure 2B:
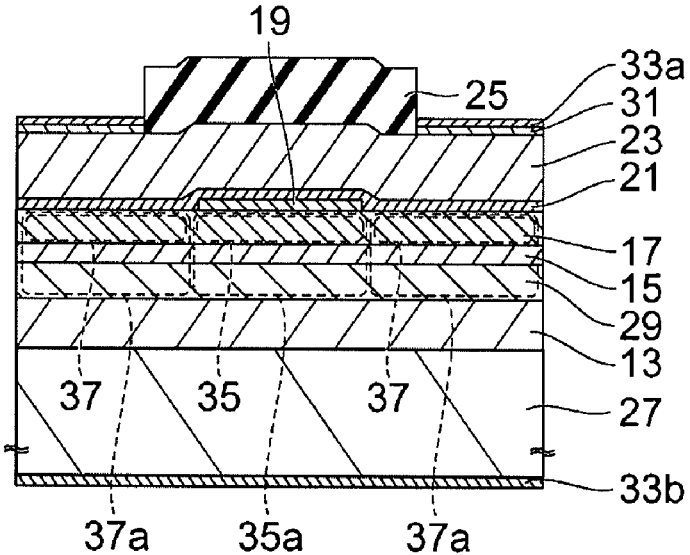
FIG. 2B is a cross section of a VCSEL with a modified structure where the VCSEL provides an implanted layer.

FIG. 2B is a cross section taken along the line A-A appeared in FIG. 1. The p-type spacer layer 17 comprises a first region 35 on the axis Ax, which heads to the second DBR 25 from the first DBR 13, and a second region 37 surrounding the first region 35. While, tri-layers of the p-type spacer layer 17, the active layer 14 and the second n-type spacer layer 29 include the third region 35a, which is provided so as to cover the active layer 15 and the second n-type space layer 29, and the fourth region 37a provided so as to surround the third region 35a. That is, the first region 35 and the third region 35a may locate beneath the first area 17b, while, the second region 37 and the fourth region 37a may locate beneath the second area 17c. The second region 37 may have the resistivity greater than that of the first region 35. Larger resistivity may be obtained by the ion implantation selectively performed in the fourth region 37a. Ions to be implanted are, for instance, proton and oxygen ion.

The VCSEL 11 according to the present embodiment has the p-type space layer 17 whose resistivity in the second region 37 thereof is greater that that of the first region 35 in the optical cavity, which may effectively reduce the inherent capacitance of the VCSEL 11 because the second region 37 becomes a substantially semi-insulating layer by the ion implantation which breaks the pn junction and eliminates the junction capacitance.

The VCSEL 11, as shown in FIGS. 1 and 2A, may further provide the first electrode 33a, for instance the anode, formed on the contact layer 31 and the second electrode 33b, for instance the cathode, formed in the back surface 27b of the substrate 27.

Figure 3A:
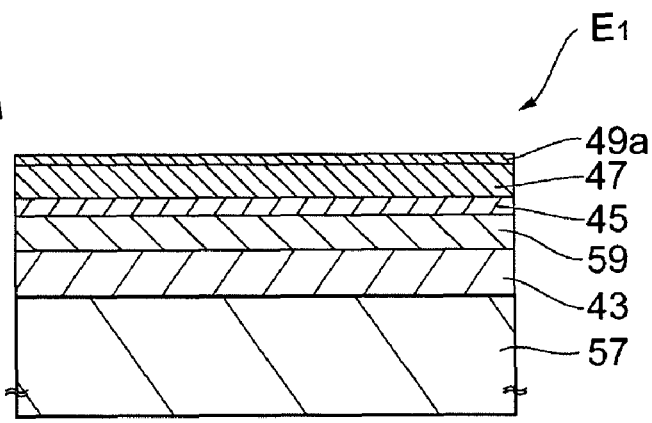
FIGS. 3A to 3D schematically illustrate processes to form the VCSEL shown in FIG. 1.
Figure 3B:
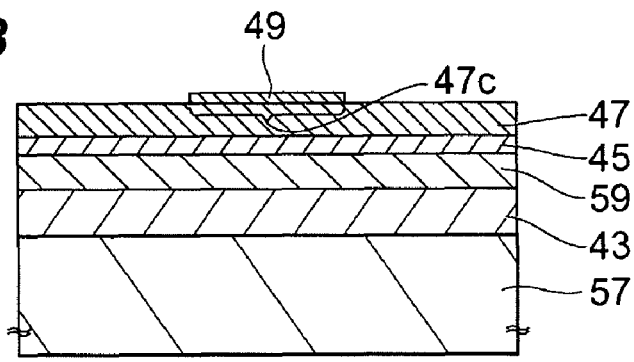
Figure 3C:
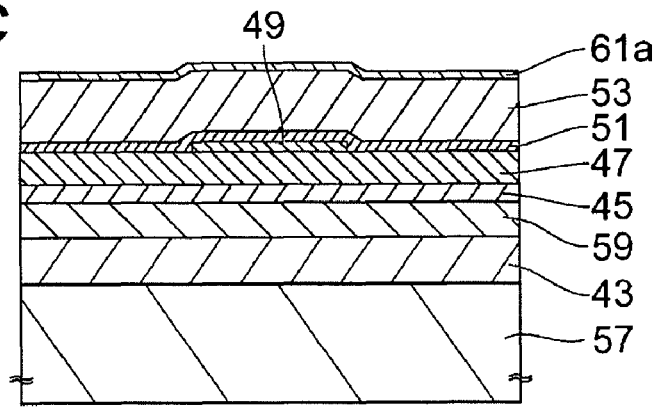

Next, an embodiment to manufacture the VCSEL 11 will be described as referring to FIGS. 3A to 4C. First, the process sequentially forms, on the GaAs substrate 57, the first DBR layer 43, the second n-type spacer layer 59, the active layer 45, the p-type spacer layer 47, and the heavily doped p-type layer 49a. The first DBR layer 43 comprises thirty-two (32) pairs of GaAs and $Al_{0.9}Ga_{0.1}As$. The second n-type space layer 59 may be an n-type GaAs doped with Si and have a thickness of about 50 nm. The active layer 45 may include three well layers of $In_{0.2}Ga_{0.8}As$. The p-type spacer layer 47 may be a p-type GaAs doped with carbon (C) and have a thickness of about 50 nm. The heavily doped p-type layer 49a, which will be converted into the p-type mesa, may be an p$^{++}$ InGaAs heavily doped with carbon (C) whose hole concentration [p] is, for instance, $1 \times 10^{20}$ cm$^{-3}$, and have a thickness of about 15 nm. These layers described above may be grown by the metal organic vapor phase epitaxy (MOVPE) technique on the GaAs substrate 57. Thus, an epitaxial substrate $E_1$ is completed, as shown in FIG. 3A.

After pulling the epitaxial substrate E1 out from the reactor of the OMVPE apparatus, a mask is formed on the epitaxial substrate E1 by the photolithography technique. The mask has a circular shape with a diameter of about 5 μm. A wet etching using this mask may form the heavily doped p-type mesa 49 on the first area 47c by selectively removing the heavily doped p-type layer 49a. This heavily doped p-type mesa 49 has a diameter of about 5 μm reflecting that of the mask.

Rinsing the epitaxial wafer with the heavily doped p-type mesa 49, the heavily doped p-type mesa 49 is thermally treated at a temperature of 600° C. under a hydrogen atmosphere for 30 minutes. The thermal treatment may be carried out just after the growth of the heavily doped p-type layer 49a before forming the heavily doped p-type mesa 49.

Figure 3D:
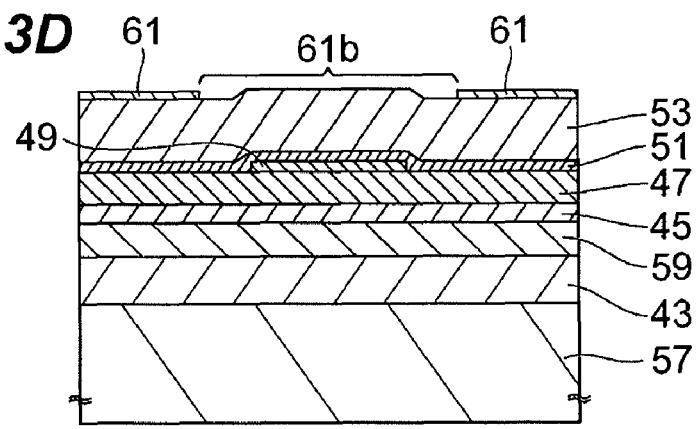

After the thermal treatment, the heavily doped n-type layer 51 is grown on the p-type spacer layer 47 and on the heavily doped p-type mesa 49. The heavily doped n-type layer 51 may be an n$^{++}$ InGaAs doped with Si and have a thickness of about 15 nm. The first n-type spacer layer 53 is grown on the heavily doped n-type layer 51. This first n-type spacer layer 53 may be an n-type GaAs and have a thickness of about 200 nm. The process grows a layer 61a on the first n-type spacer layer 53. The layer 61a may be an n-type GaAs doped with Si and have a thickness of about 50 nm. The wet-etching of the layer 61a forms the contact layer 61 with the opening 61b as illustrated in FIG. 3D. This opening 61b locates on an area where the optical cavity to be formed.

Figure 4A:
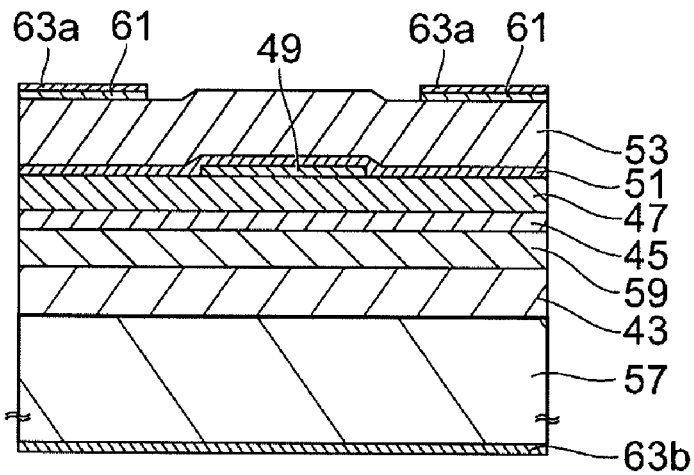
FIGS. 4A to 4C schematically illustrate processes to form the VCSEL subsequent to the process shown in FIG. 3D.
Figure 4B:
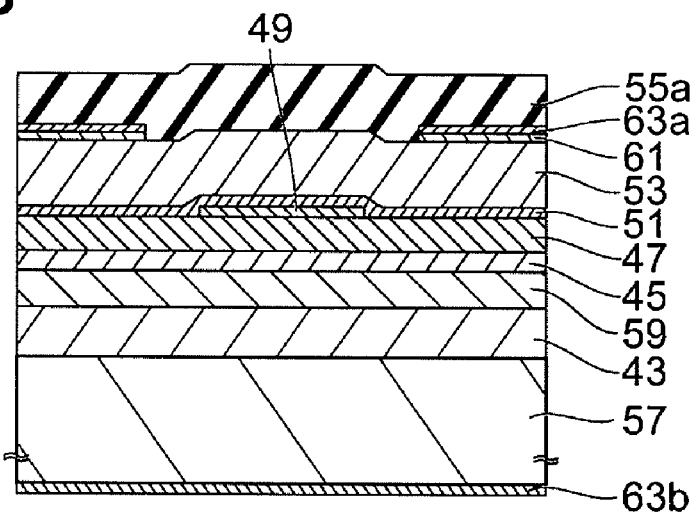
Figure 4C:
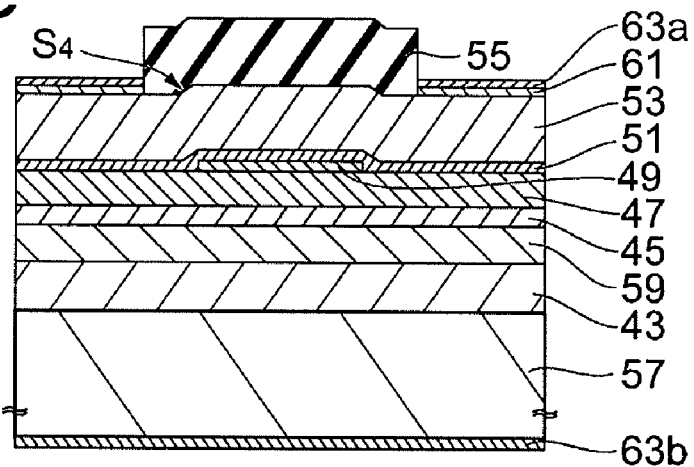

Two electrodes, the anode 63a and the cathode 63b, are formed on respective position by the metal evaporation, as shown in FIG. 4A. Subsequently, a multilayered dielectric film 55a for the second DBR 55 is formed on the anode 63a and within the opening 61b. The dielectric film 55a may include a plurality of $SiO_2$ and $TiO_2$ alternately stacked to each other, shown in FIG. 4B. Finally, this multilayered dielectric film 55a is etched so as to form the second DBR layer 55 only in the opening 61b by removing a portion provided on the anode 63.

According to the method to get the VCSEL 11 described above, the heavily doped n-type layer 51 and the first n-type spacer layer 53 are sequentially grown after forming the heavily doped p-type mesa 49 by etching the heavily doped p-type layer 49a. The surface of the heavily doped n-type layer 51 appears a step whose height reflects the height of the heavily doped p-type mesa 49 and the surface of the first n-type spacer layer 53 also appears a step whose height reflects the height of the step formed in the surface of the heavily doped n-type layer 51. Thus, the step $S_4$ appeared in the surface of the first n-type spacer layer 53, which derives from the height of the heavily doped p-type mesa 49, becomes relatively small. Although the second DBR 55 is formed in an area on the first n-type spacer layer 53 covering this step $S_4$, the optical scattering at the step may be reduced because the slope of the step $S_4$ becomes moderate.

Moreover, the heavily doped n-type layer 51 is formed on the p-type spacer layer 47 so as to cover the top and the side of the heavily doped p-type mesa 49. The electron concentration [n] in this heavily doped n-type layer 51 may be less than the hole concentration [p] in the heavily doped p-type mesa 49; accordingly, the optical absorption loss may be reduced even when the heavily doped n-type layer 51 is grown on areas out of the heavily doped p-type mesa 49. Because the optical absorption in the n-type semiconductor layer is obtuse for the increase of the doping concentration therein, the increase of the absorption loss may be eliminated even when the heavily doped n-type layer 51 is formed within the optical cavity.

Because the electron concentration [n] in the heavily doped n-type layer 51 is less than the hole concentration [p] in the heavily doped p-type mesa 49, the depletion layer attributed with the pn junction formed in the interface between the p-type spacer layer 47 and the heavily doped n-type layer 51 extends within the side of the heavily doped n-type layer 51, which restricts the increase of the junction capacitance.

According to the technique for the VCSEL described above, the thermal treatment of the heavily doped p-type mesa 49 before the re-growth for the heavily doped n-type layer 51, that is, the thermal treatment may be carried out before the formation of the pn junction between the heavily doped p-type mesa 49 and the heavily doped n-type layer 51. Accordingly, the increase of the resistance of the tunnel junction due to the inter-diffusion of the doping atoms in the heavily doped p-type mesa 49 and in the heavily doped n-type layer 51 may effectively reduced, which results in an increase of the activating efficiency of the dopant in the heavily doped p-type mesa 49. An alternate method, in which the thermal treatment for the heavily doped p-type layer 49a is carried out before the formation of the p-type mesa 49, may appear a similar efficiency.

Figure 5A:
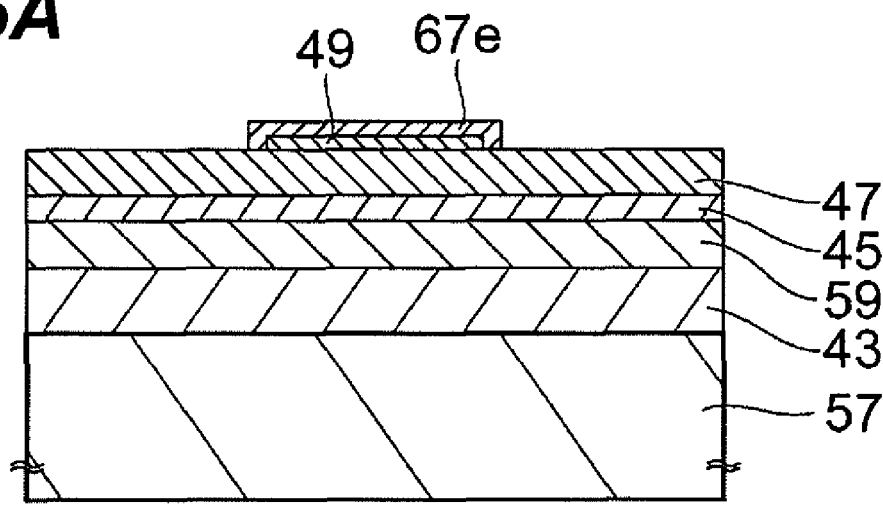
FIGS. 5A and 5B schematically illustrate processes to form the modified VCSEL whose cross section is illustrated in FIG. 2B.
Figure 5B:
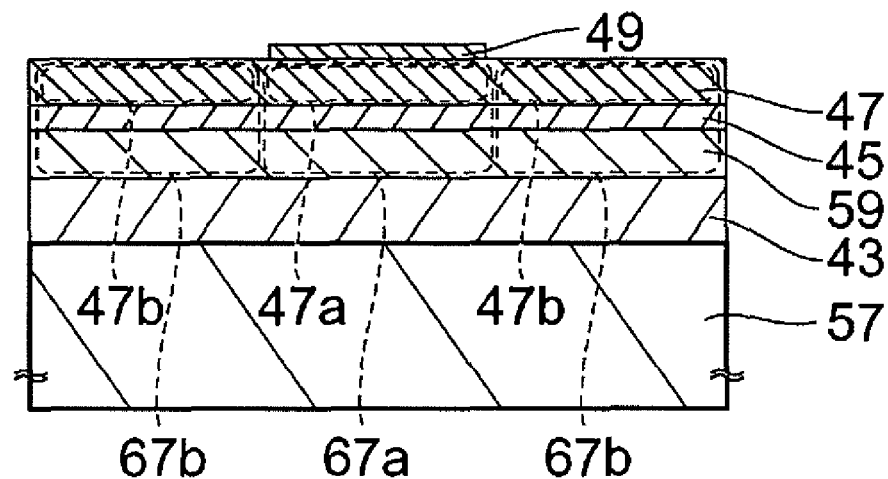

The method of the present embodiment may further comprise a step of the ion implantation. As illustrated in FIG. 5A, the process may form a mask 67e for the ion implantation by the photolithography on the p-type spacer layer 47 so as to cover the top and the side of the heavily doped p-type mesa 49. This mask 67e may be a photoresist. Subsequently, the ion implantation may be carried out by a condition of, the type of ion species is proton, the acceleration voltage is 100 keV and the dosage is $1 \times 10^{15}$ cm$^{-2}$.

The p-type spacer layer 47 may include a first region 47a and a second region 47b surrounding the first region 47b. The tri-layer of the p-type spacer layer 47, the active layer 45 and the second n-type spacer layer 59 may include a third region 67a, which covers this tri-layer and includes the first region 47a, and a fourth region 67b surrounding the third region 67a. The ion implantation implants protons selectively in the fourth region 67b to increase the resistivity of the second region 47b compared with that of the first region 47a. The ion species may be oxygen ions instead of the proton.

The method according to the embodiment described above may increase the resistivity of the second region 47b of the p-type spacer layer compared with that of the first region 47a. Moreover, the ion implantation converts the second region 47b into a substantially semi-insulating region, which decreases the junction capacitance attributed with the pn junction.

Next, the structure of the VCSEL 11 of the present embodiment will be compared with VCSELs with conventional structures. The VCSEL 11 shown in FIG. 2A has the arrangement listed in the following Table I.

TABLE I

Structure of VCSEL of the invention

| | |
|---|---|
| Substrate 27 | n-GaAs |
| First DBR layer 13 | 32 pairs of GaAs and $Al_{0.9}Ga_{0.1}As$ doped with Si |
| Second n-type spacer layer 29 | n-GaAs doped with Si thickness: 50 nm |
| Active layer 15 | QW structure with 3 well layers of $In_{0.2}Ga_{0.8}As$ |
| p-type spacer layer 17 | p-GaAs doped with C thickness: 50 nm |
| heavily doped p-type mesa 19 | p$^{++}$ InGaAs doped with C [p]: $1 \times 10^{20}$ cm$^{-3}$ thickness: 15 nm thermally treated at 600° C. for 30 min. under a hydrogen atmosphere |
| heavily doped n-type layer 21 | n$^{++}$ InGaAs doped with Si [n]: $5 \times 10^{18}$ cm$^{-3}$ thickness: 15 nm |
| first n-type spacer layer 23 | n-GaAs doped with Si thickness: 200 nm |
| Contact layer 31 | n-GaAs doped with Si thickness: 50 nm |
| Second DBR layer 25 | 7 pairs of $SiO_2$ and $TiO_2$ |

Figure 6A:
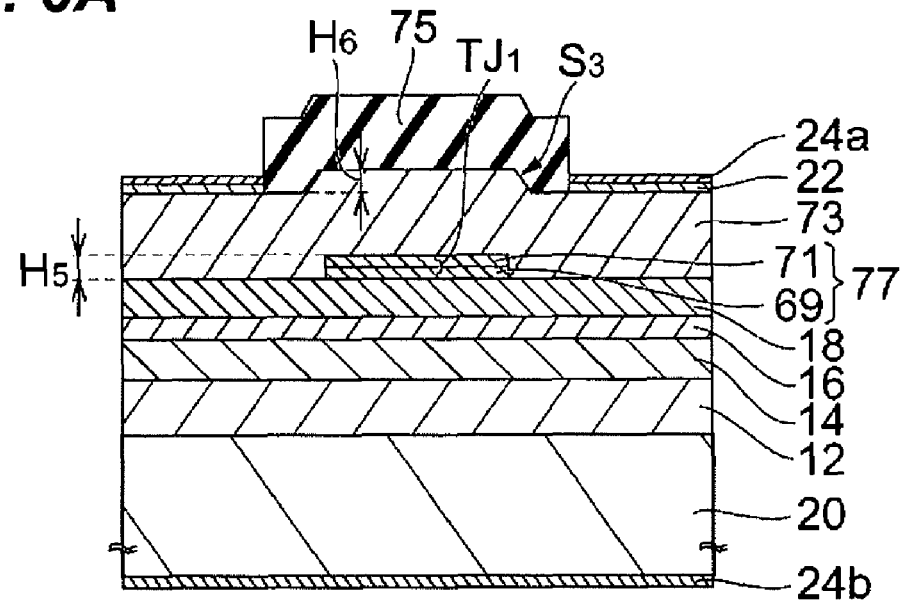
FIGS. 6A and 6B illustrate cross sections of comparative VCSELs whose layer structure to constitute the tunnel junction follows a conventional manner.

A comparative VCSEL, which is denoted as VCSEL A, whose structure is shown in FIG. 6A provides a mesa 77 for the tunnel junction that includes a heavily doped p-type mesa 69 and a heavily doped n-type mesa 71. Between the heavily doped p-type mesa 69 and the heavily doped n-type mesa 71 is formed with the tunnel junction $TJ_1$. A process to form the VCSEL shown in FIG. 6A does not perform the thermal treatment of the heavily doped p-type mesa 69 before the formation of the heavily doped n-type mesa 71. The VCSEL shown in FIG. 6A has a structure listed in Table II:

TABLE II

Structure of comparative VCSEL A

| | |
|---|---|
| Substrate 20 | n-GaAs |
| First DBR layer 12 | 32 pairs of GaAs and $Al_{0.9}Ga_{0.1}As$ doped with Si |
| Second n-type spacer layer 14 | n-GaAs doped with Si thickness: 50 nm |
| Active layer 16 | QW structure with 3 well layers of $In_{0.2}Ga_{0.8}As$ |
| p-type spacer layer 18 | p-GaAs doped with C thickness: 50 nm |
| Heavily doped p-type mesa 69 | $p^{++}$ InGaAs doped with C [p]: $1 \times 10^{20}$ cm$^{-3}$ thickness: 15 nm |
| Heavily doped n-type mesa 71 | $n^{++}$ InGaAs doped with Si [n]: $5 \times 10^{18}$ cm$^{-3}$ thickness: 15 nm |
| First n-type spacer layer 73 | n-GaAs doped with Si thickness: 200 nm |
| Contact layer 31 | n-GaAs doped with Si thickness: 50 nm |
| Second DBR layer 25 | 7 pairs of $SiO_2$ and $TiO_2$ |

Another comparative VCSEL denoted as VCSEL B provides a tunnel junction $TJ_2$ at the interface between a heavily doped p-type layer 79 and a heavily doped n-type mesa 81. A process to form the VCSEL B does not carry out the annealing of the heavily doped p-type layer 79 before the formation of the heavily doped n-type mesa 81. The arrangement of the VCSEL B is shown in Table III below:

TABLE III

Structure of comparative VCSEL B

| | |
|---|---|
| Substrate 27 | n-GaAs |
| First DBR layer 32 | 32 pairs of GaAs and $Al_{0.9}Ga_{0.1}As$ doped with Si |
| Second n-type spacer layer 34 | n-GaAs doped with Si thickness: 50 nm |
| Active layer 36 | QW structure with 3 well layers of $In_{0.2}Ga_{0.8}As$ |
| p-type spacer layer 38 | p-GaAs doped with C thickness: 50 nm |
| Heavily doped p-type layer 79 | $p^{++}$ InGaAs doped with C [p]: $1 \times 10^{20}$ cm$^{-3}$ thickness: 15 nm |
| Heavily doped n-type mesa 81 | $n^{++}$ InGaAs doped with Si [n]: $5 \times 10^{18}$ cm$^{-3}$ thickness: 15 nm |
| First n-type spacer layer 83 | n-GaAs doped with Si thickness: 200 nm |
| Contact layer 42 | n-GaAs doped with Si thickness: 50 nm |
| Second DBR layer 46 | 7 pairs of $SiO_2$ and $TiO_2$ |

The threshold current $I_{th}$ for the laser emission, a maximum output power $P_{max}$ and a differential resistance rr at a driving current of 10 mA of the VCSEL of the present embodiment, the comparative VCSEL A and the comparative VCSEL B are summarized as follows:

TABLE IV

Comparison of lasing characteristics in various VCSELs

| | $I_{th}$ (mA) | $P_{max}$ (mW) | rr (Ω) |
|---|---|---|---|
| VCSEL of the embodiment | 0.4 | 3.2 | 45 |
| comparative VCSEL A | 0.8 | 2.7 | 60 |
| comparative VCSEL B | 0.9 | 2.6 | 60 |

The threshold current $I_{th}$ of the comparative VCSEL A was greater than that of the VCSEL of the present embodiment, while, the maximum output power $P_{out}$ of the comparative VCSEL A was less than that of the present VCSEL. Because the process to form the comparative VCSEL A grew the first n-type spacer layer 73 so as to bury the tunnel junction mesa 77, the spacer layer 73 appeared a step $S_3$ between an area on the tunnel junction mesa 77 and an area out of the tunnel junction mesa 77. Thus, the height $H_6$ of this step $S_3$ was comparative with the height $H_5$ of the tunnel junction mesa 77 including two layers of the heavily doped p-type mesa 69 and the heavily doped n-type mesa 71. On the other hand, the present VCSEL 11 shows the step $S_2$ with the height $H_3$ that reflects the height of the heavily doped p-type mesa 19 including only one layer. Thus, the height $H_6$ of the step $S_3$ was inevitably greater than the height $H_3$ of the step $S_2$. Because the second DBR 75 in the comparative VCSEL A was formed so as to cover the step $S_3$, the step $S_3$ scattered light within the cavity to increase the threshold current $I_{th}$ and to reduce the maximum output power $P_{out}$.

The comparative VCSEL B also showed a threshold current $I_{th}$ larger than that of the present VCSEL, and a smaller optical output power Pout than that of the present VCSEL. The comparative VCSEL B provided the heavily doped p-type layer 79 within the optical cavity. Generally, the free electron absorption becomes dominant for a semiconductor material doped with n-type dopant, while, the absorption due to the inter-band transition becomes dominant for a material doped with p-type dopant. The free electron absorption shows a lesser absorption co-efficient than that of the inter-band transition. Therefore, the heavily doped p-type layer 79 within the optical cavity causes larger absorption compared with a case when the heavily doped n-type layer 81 exists within the optical cavity. Moreover, because the hole concentration [p] in the heavily doped p-type layer 79 is greater than the electron concentration [n] in the heavily doped n-type mesa 81, the optical absorption further increases to enhance the absorption loss in the heavily doped p-type layer 79. The increase of the optical absorption causes the increase of the threshold current $I_{th}$ and decreases the optical output power $P_{out}$.

The present VCSEL indicated the differential resistance rr less than that of the comparative VCSEL A and also that of the comparative VCSEL B. The present VCSEL provides the heavily doped p-type mesa 19 thermally treated before the growth of the heavily doped n-type layer 21. Then, the activation of the p-type dopants in the heavily doped p-type mesa 19 was effectively carried out compared with the comparative VCSEL A and the comparative VCSEL B. Moreover, the thermal treatment of the heavily doped p-type mesa 19 before the growth of the heavily doped n-type layer 21 may effectively suppress the inter-diffusion of the dopants between the heavily doped layers, 19 and 21, which may reduce the resistivity of the heavily doped p-type layer.

The present VCSEL shown in FIG. 2B provides the ion-implanted layer. As already described, the conditions of the ion-implantation were, the type of ion species was proton, the acceleration voltage was 100 keV, and the dosage was $1 \times 10^{15}$ cm$^{-2}$.

Figure 6B:
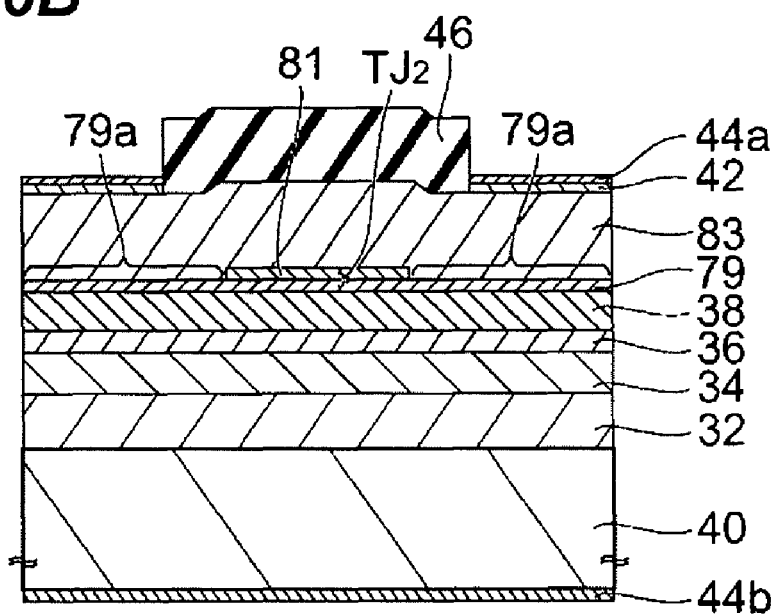

The capacitance attributed with the VCSEL was practically measured for those VCSELs based on the high frequency performance thereof, namely, the present VCSEL shown in FIG. 2A and that shown in FIG. 2B with the implanted region, the comparative VCSEL A shown in FIG. 6A and the comparative VCSEL B shown in FIG. 6B, and the results are summarized in the next table IV.

TABLE IV

Comparison of Junction Capacitance

| Type of VCSEL | Capacitance (pF) |
|---|---|
| present VCSEL shown in FIG. 2A without any implanted region | 0.4 |
| present VCSEL shown in FIG. 2B with implanted region | 0.2 |
| comparative VCSEL A | 0.4 |
| comparative VCSEL B | 0.5 |

The present VCSEL with the implanted region showed a junction capacitance smaller than that of the present VCSEL without the implanted region. Because the former VCSEL provided the fourth region 37a implanted with protons, the resistivity of the second region 37 was greater than that of the first region 35. Moreover, the second region was converted into a substantially semi-insulating by the proton implantation; accordingly, the capacitance attributed with the pn junction decreased.

The capacitance of the present VCSEL without any implanted region was comparative with that of the comparative VCSEL A and the comparative VCSEL B. Although the present VCSEL provides the heavily doped n-type layer 21 within the optical cavity, the dopant density of this n-type layer 21 is less than that of the heavily doped p-type mesa 19; accordingly, the depletion region formed in an interface between the heavily doped n-type layer 21 and the heavily doped p-type mesa 19 extends in a side of the heavily doped n-type layer 21, which suppresses the increase of the junction capacitance.

The capacitance of the comparative VCSEL B was greater than that of the present VCSEL without any implanted region and that of the comparative VCSEL A. Because the comparative VCSEL B provide the heavily doped p-type layer 79 whose dopant density was greater than that of the heavily doped n-type mesa 81, the depletion layer formed in the interface between the heavily doped p-type layer 79 and the n-type spacer layer 83 became thinner, which increases the junction capacitance.

While the preferred embodiments of the present invention have been described in detail above, many changes to these embodiments may be made without departing from the true scope and teachings of the present invention. The present invention, therefore, is limited only as claimed below and the equivalents thereof.

I claim:

1. A vertical cavity surface emitting laser diode, comprising:
   a first Bragg reflector comprised of an n-type semiconductor material;
   an active layer provided on said first Bragg reflector;
   a p-type spacer layer provided on said active layer, said p-type spacer layer having a primary surface with a first area and a second area surrounding said first area;
   a heavily doped p-type mesa provided on said first area of said p-type spacer layer;
   a heavily doped n-type layer provided on said first area and said second area of said p-type spacer layer that covers a top and a side of said heavily doped p-type mesa;
   a first n-type spacer layer provided on said heavily doped n-type layer;
   a second Bragg reflector provided on said first n-type spacer layer,
   wherein said heavily doped p-type mesa and said heavily doped n-type layer forms a tunnel junction.

2. The vertical cavity surface emitting laser diode according to claim 1,
   wherein said p-type spacer layer provides a first region including an axis heading from said first Bragg reflector to said second Bragg reflector and a second region surrounding said first region, said heavily doped p-type mesa being provided in said first region, and
   wherein said second region has resistivity greater than resistivity of said first region.

3. The vertical cavity surface emitting laser diode according to claim 2,
   wherein the second region includes at least one of proton and oxygen implanted therein.

4. The vertical cavity surface emitting laser diode according to claim 1,
   wherein said heavily doped p-type mesa is made of semiconductor material containing gallium (Ga) and arsine (As), said heavily doped n-type layer is made of semiconductor material containing indium (In), gallium (Ga) and arsine (As), and said first n-type spacer layer is made of semiconductor material containing gallium (Ga), and at least one of arsine (As) and phosphorus (P).

* * * * *